United States Patent [19]

Carbrey

[11] 3,735,393

[45] May 22, 1973

[54] SELF COMPANDING PULSE CODE MODULATION SYSTEMS

[75] Inventor: Robert L. Carbrey, Boulder, Colo.

[73] Assignee: Bell Telephone Laboratories, Incorporated, Murray Hill, Berkeley Heights, N.J.

[22] Filed: Nov. 22, 1971

[21] Appl. No.: 200,781

Related U.S. Application Data

[63] Continuation of Ser. No. 879,661, Nov. 25, 1969, abandoned.

[52] U.S. Cl......340/347 DA, 179/15 AC, 179/15 AP, 340/347 AD

[51] Int. Cl...............................................H03k 13/04

[58] Field of Search................340/347 DA, 347 AV, 340/15.5; 179/15 AC, 15 AP; 325/38; 332/11; 235/150.51, 150.52

[56] References Cited

UNITED STATES PATENTS

| | | | |
|---|---|---|---|
| 3,419,819 | 12/1968 | Murakami | 340/347 AD |
| 3,588,530 | 6/1971 | Langan | 340/347 DA |
| 3,180,939 | 4/1965 | Hall | 340/347 AD |
| 3,585,633 | 6/1971 | Young | 340/347 AD |
| 3,588,882 | 6/1971 | Propster | 340/347 DA |
| 3,603,975 | 9/1971 | Gordon | 340/347 AD |

*Primary Examiner*—Maynard R. Wilbur
*Assistant Examiner*—Jeremiah Glassman
*Attorney*—W. L. Keefauver

[57] ABSTRACT

A self companding analog digital system produces a desired compression expansion curve by switching the gain ratio of an operational amplifier in accordance with a binary code.

6 Claims, 7 Drawing Figures

INVENTOR
R. L. CARBREY
BY David P. Kelley
ATTORNEY

SELF COMPANDING PULSE CODE MODULATION SYSTEMS

This application is a continuation of application Ser. No. 879,661, filed Nov. 25, 1969 now abandoned.

BACKGROUND OF THE INVENTION

This invention relates to digital transmission, and, more particularly, to the nonlinear conversion of analog and PCM signals, one to the other, in which volume range compression and expansion, i.e., companding, is utilized.

In the conversion of an analog message signal to PCM for transmission, the signal is first sampled and quantized. The quantizing process entails assigning the nearest in magnitude of one of a number of discrete values or alternatively the nearest discrete value which is greater, called quantum levels, to the analog signal sample. Only in rare instances is there a quantum level exactly equal to the signal sample level, the remainder of the time there is a marked difference between the exact value of the signal and of the quantum level. This difference, which represents a form of distortion inherent in PCM transmission systems, is known as quantizing noise. In an encoding system where there is a linear relationship between the analog signal and the quantum levels, i.e., the quantum levels differ from each other by equal increments or steps, quantizing noise is not of particular concern at high signal levels, since the signal to quantizing noise ratio is high. On the other hand, at low signal levels, the signal to quantizing noise ratio can be so small as to be intolerable.

In order to overcome the undesirable relationship between low valued message samples and the attendant quantizing noise, it is advantageous to distribute the quantum levels so that the average signal to quantizing noise ratio will be kept at a maximum or optimum within the system constraints. This distribution, which results in a nonlinear encoding characteristic, is usually such that more quantum levels are allocated to the low valued samples of the message signal than to the high valued samples. The low valued samples are accordingly more accurately defined as they are translated into a representative code. Since the dynamic range of the message signal is thus effectively compressed, the low valued samples are emphasized, i.e., effectively increased in amplitude, while the high valued samples are de-emphasized. In any case an ideal allocation of the available quantum levels or, in other words, an ideal encoding characteristic, will depend upon the statistical amplitude distribution of the message signal.

Companding therefore serves a special purpose in digital transmission systems in that it reduces the magnitude of the quantizing error for low amplitude signals where quantizing distortion would be a serious matter at the price of increasing quantizing error for high amplitude signals where increased distortion can be tolerated.

The usual companding system incorporates as its main components a compressor at the transmitter and an expandor at the receiver. These components are normally separate units, the compressor being connected externally in tandem with the encoder and the expandor being connected externally in tandem with the decoder. PCM systems have been devised however that combine the processes of coding and compression at the transmitting end and the processes of decoding and expansion at the receiving end. In U.S. Pat. No. 2,889,409 of R. L. Carbrey there is disclosed a hyperbolic compander using a feedback amplifier. Such feedback arrangements as therein disclosed are representative of one class of compander of which the present invention is an example.

SUMMARY OF THE INVENTION

In an illustrative embodiment of the invention a voltage divider network having a plurality of weighted resistors connected in parallel is switched under control of coding logic so that various ones of the resistors are switched between the input and feedback paths of an operational amplifier. The gain of the amplifier thus varies from zero when all of the resistors are in the feedback path to a high value when all but a fixed feedback resistor is in the input path. For symmetric companding the input voltage to the amplifier is switched under control of digit 1 of the coded signal. The resistors are chosen to give the desired companding function and the companding curve can be adjusted further by fixed resistors shunting either the feedback or input paths of the operational amplifier.

It is a feature of the present invention that the gain ratio of an operational amplifier is switched in accordance with the binary code to generate a hyperbolic compression characteristic. In addition the relationship of the quantized levels is independent of the magnitude of the reference voltage. An optimum match to the signal level can be achieved by judicious choice of reference voltage in a composite instantaneous and syllabic compander. Alternatively, the arrangement of the invention lends itself readily to automatic sealing.

DESCRIPTION OF THE DRAWINGS

These and other features of the present invention will be more readily apparent from the following detailed description taken in conjunction with the accompanying drawings in which.

DETAILED DESCRIPTION

Figure 1:
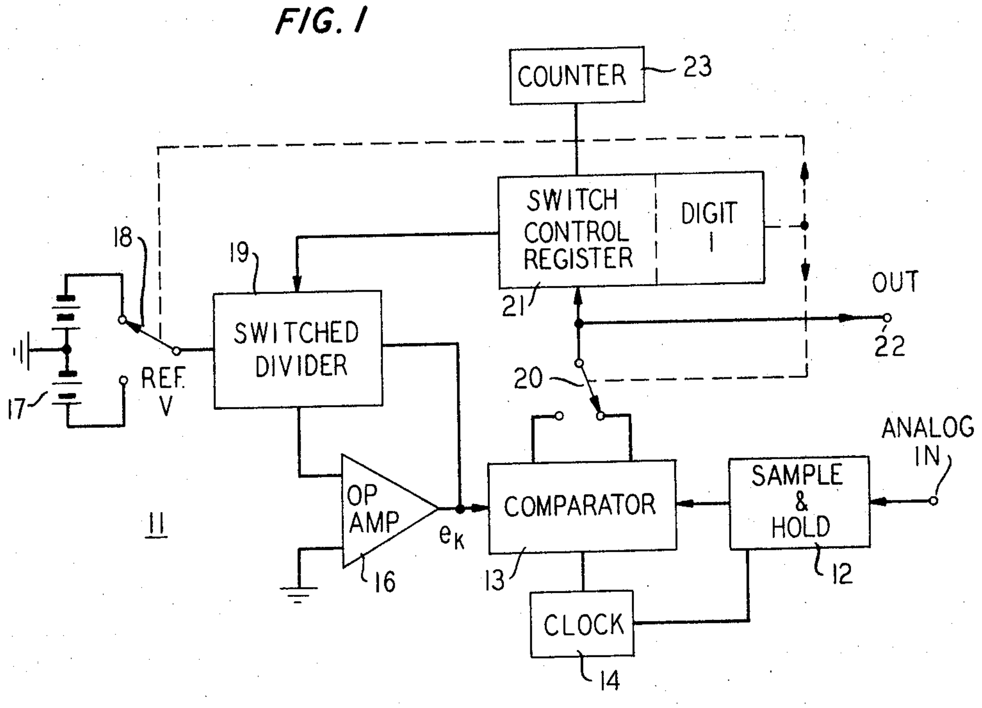
FIG. 1 is a block diagram of a first illustrative embodiment of the invention.

Turning now to the drawings, there is depicted in FIG. 1 in block diagram, an analog to digital converter 11 embodying the principles of the present invention. Converter 11 comprises a sample and hold circuit 12 to which analog signals to be converted are applied from a suitable source, not shown. The analog signal sample output of circuit 12 is applied to a comparator circuit 13, which, under control of pulses from a clock source 14, compares the signal sample with the output $e_k$ of an operational amplifier 16. The input to amplifier 16 is supplied by a reference voltage source 17, shown schematically as a battery, through a polarity switch 18 and a switched voltage divider network 19 to be more fully described hereinafter.

The output of comparator 13 is applied, in the form of pulses as will be explained hereinafter through a single pole, double throw switch 20 to a switch control register 21 and to an output terminal 22. Switch control register 21, under control of a reset counter 23, produces a polarity indication on the first pulse of the digit sequence, and actuates switches 18 and 20 to provide the proper polarities of source 17 and the comparator 13 output. Register 21 reacts to the remaining digits of the code word to actuate switches in the voltage divider network 19 to vary the gain of amplifier 16 to produce compression.

Figure 2A:
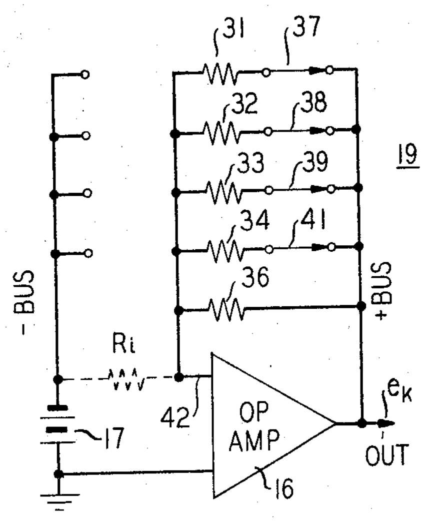
FIGS. 2A and 2B are diagrammatic views of a portion of the circuit of FIG. 1.
Figure 2B:
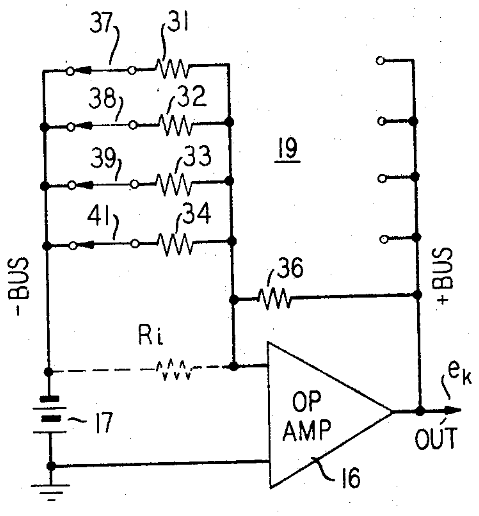

In FIGS. 2A and 2B there are shown schematically the voltage divider network configurations for minimum gain and maximum gain of the operational amplifier for positive going signals in a five digit code arrangement. In all of the ensuring discussion, a five digit code, in which the first digit serves as a polarity indicator, will be assumed. It will be readily apparent that the invention is usable with other types of codes, and readily adaptable thereto.

Network 19 comprises a plurality of weighted resistors 31, 32, 33, 34, 36, having the values R, 2R, 4R, 8R, and 8R respectively. One side of each of resistors 31 through 36 is connected to one input 42 of the operational amplifier 16, while the other ends of resistors 31 through 34 are connected, by means of single pole-double throw switches 37, 38, 39, 41, respectively, to either the reference voltage source 17 or to the output of the amplifier 16, shown as negative and positive buses, respectively. Resistor 36 is permanently connected from the amplifier output to the input. Switches 37, 38, 39, and 41 are actuated and controlled by the switch control register 21. These switches may take any one of a number of suitable forms, such as, for example, fast acting semiconductor diode switches.

The switched resistance divider arrangement shown in FIGS. 2A and 2B is particularly suitable for nonlinear operation because the reference voltages need not be large. In the arrangement shown, which is for a five digit code, there are 16 possible unique divider combinations. The combination of FIG. 2A is for zero gain, that is $e_k = 0$, and the input voltage is zero. If some minimum value of $e_k$ is desired, a fixed input resistor $R_i$, shown in dashed line, may be used. For purposes of the present discussion, it will be assumed that $R_i$ is not used. As a consequence, in FIG. 2A, all of the resistors are in the feedback path, and the amplifier output $e_k$ is zero, since the gain of an operational amplifier is the ratio of the feedback resistance to the input resistance. In FIG. 2A the input resistance is infinite without $R_i$. At the other extreme, as shown in FIG. 2B, resistors 31, 32, 33, and 34 are connected in parallel in the input to amplifier 16, giving an input resistance of 8R/15 and a feedback resistance of 8R, with a resultant amplifier gain of 15. Thus the amplifier output $e_k$ is 15V where −V is the reference voltage of source 17.

Intermediate values of gain are determined by the particular switch combination. It is readily apparent that the divider ratios form the series 1/15, 1/7, 3/13, 1/3, 5/11, 3/5, 7/9, 1, 9/7, 5/3, 11/5, 3, 13/3, 7, and 15 for the amplifier gain ratio. The amplifier gain for the $k^{th}$ code combination is given by $$G_k = k/2^n - k \qquad (1)$$

for $k = 0$ to $k = 2^n - 1$ where $n$ is the number of digits in the code. Since the amplifier inverts the input, i.e., produces a positive output voltage for a negative input voltage, or vice versa, the feedback is negative, and therefore stably controls the voltage input to the amplifier.

In the operation of the arrangement of FIG. 1, the switch control register 21, under control of the counter and reset circuit 23, actuates the switches of divider 19 so that all of the resistors are in the feedback path and the gain of the amplifier is zero. The analog signal, e.g., voice signals, is applied to the sample and hold circuit 12, the output of which is applied to comparator 13. The switch control register 21, under control of counter 23, generates a first digit condition. With the gain of amplifier 16 at zero, the amplifier input to comparator 13 is zero. If the signal input to comparator 13 is positive, the comparator 13, under control of the clock 14, which operates at the pulse rate of the desired PCM signal, produces no output, and the first transmitted pulse of the code word is a zero pulse, indicating a positive going signal.

The switch control register 21 next establishes the second digit comparison condition, which actuates switch 37 to switch resistor 31 from the amplifier feedback path to the input path, thereby giving an amplifier gain of unity and an output $e_k$ of V, where V is the voltage of the source 17. If the analog signal sample is greater than $e_k$, no output pulse is produced by the comparator, and the digit 3 comparison condition is next established by the register 21 under control of counter 23. On the other hand, if the analog signal sample is less than $e_k$, the comparator 13 generates a pulse, the digit 2 position in switch control register 21 is reset, and the resistor network is switched back to what it was before digit 2 was generated. For digit 3, where the analog signal sample was greater than $e_k$ and no output pulse was generated at digit 2, register 21 actuates switch 38, placing resistor 32 in parallel with resistor 31 in the input to amplifier 16. The gain ratio of amplifier 16 is then 3, and $e_k$ is equal to 3V. If the analog signal is still greater, at digit 4 switch 39 is actuated and resistor 33 is connected in parallel with resistors 31 and 32 in the amplifier input. The gain of the amplifier becomes 7 and $e_k$ is 7V. At digit 5, assuming the signal sample at digit 4 was greater than $e_k$, resistor 34 is placed in parallel with resistors 31, 32, and 33, and the gain of amplifier 16 becomes 15. Thus it can be seen that for large signal samples, the quantizing steps are in ever increasing increments, in the order 1, 3, 7, and 15 for a five digit code, and the output of the coder is 00000 for the positive going signal.

On the other hand, as pointed out before, if, at digit 2, the signal sample is less than $e_k$, which at digit 2 is equal to V, a pulse is generated and switch control register 21 is reset and resistor 31 is switched back to the feedback path. At digit 3, switch 38 is actuated and resistor 32 is switched to the amplifier input. The gain of amplifier 16 is then ⅓ and $e_k$ is equal to V/3. If the signal sample is still less than $e_k$, comparator 13 generates a pulse and the digit 3 position in the switch control register is again reset, with resistor 32 being switched back to the feedback path. At digit 4, resistor 33 is switched to the amplifier input, producing an amplifier gain ratio of 1/7 and an $e_k$ of V/7. If the signal sample is smaller than $e_k$, a pulse is generated and the circuits are reset. At digit 5, resistor 34 is switched and $e_k$ becomes V/15.

Figure 3:
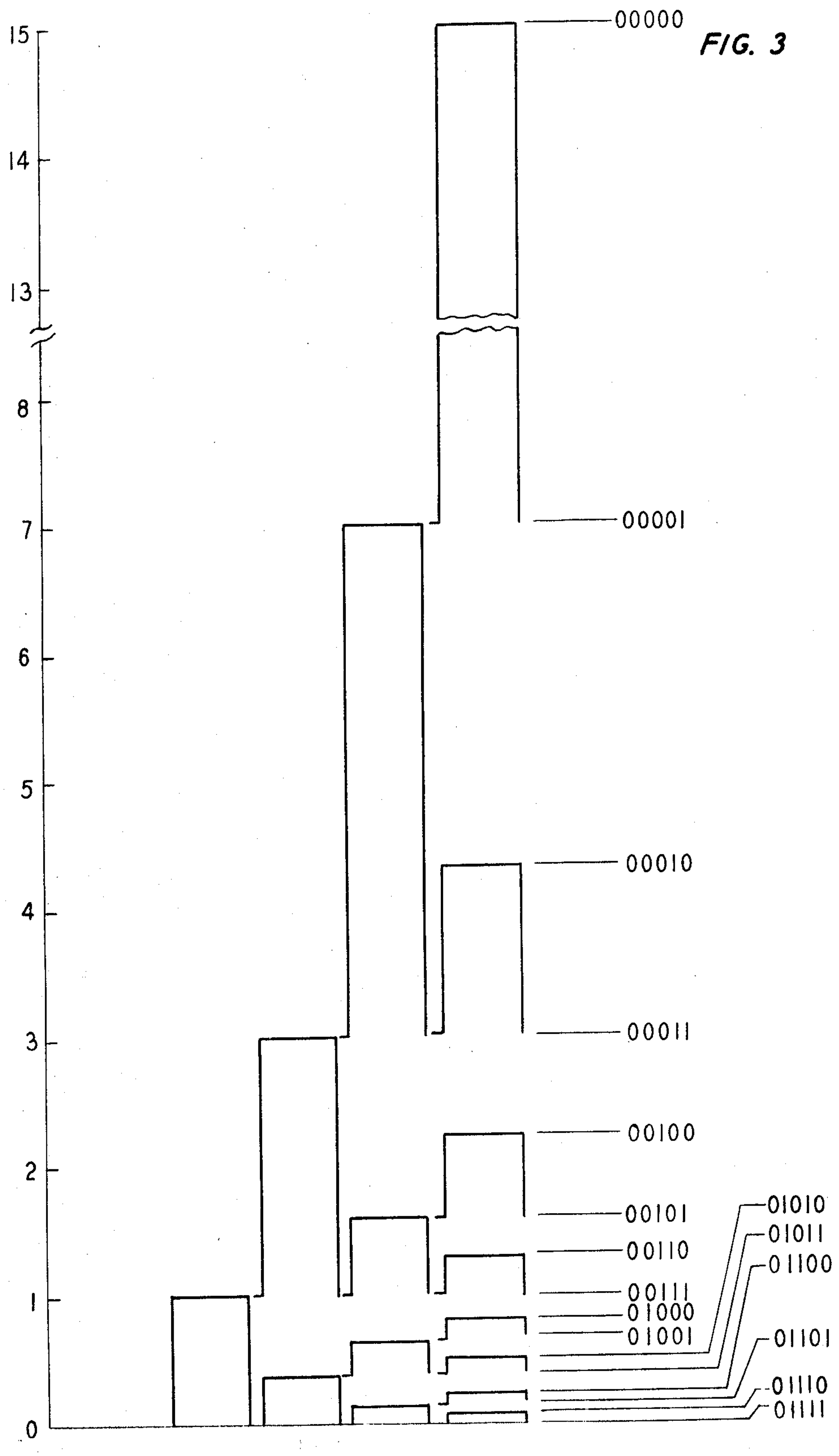
FIG. 3 is a diagram of the quantizing function of the arrangement of FIGS. 1 and 2.

From the foregoing, it can be seen that the arrangement of FIG. 1 automatically produces companding, the quantizing steps increasing in the order 1, 3, 7, and 15 for large signals in excess of or equal to 15, and decreasing in the order 1, 1/3, 1/7, and 1/15 for small signals less than or equal to 1/5. For values greater than 1 but less than 15, one or more of resistors 32, 33, and 34 will be switched back to + Bus 19, this gives intermediate quantized gains. The various combinations produce gains of 9/7, 5/3, 11/5, 3, 13/3, 7, and 15. For values less than 1 but greater than 1/15, one or more of resistors 32, 33, and 34 will remain switched to Battery 17. These various combinations produce quantized gains in addition to 1 of 7/9, 3/5, 5/11. 1/3, 3/13, 1/7, and 1/15. In FIG. 3 there is depicted a tree diagram of the quantizing step variations and corresponding coded outputs for the system of FIG. 1. The code combination shown is produced for all input levels greater than shown but less than or equal to the level immediately above. It can readily be appreciated that the complement of the digit code of FIG. 3 may be used by simply reversing the operation of the comparator to produce a pulse where in the foregoing it produced a no pulse.

Thus far the discussion has dealt with a positive going signal. The encoder of FIG. 1 is symmetrical, operating on negative going signals in the same manner that it operates on positive going signals. In the case of a negative signal, at digit 1 the comparator produces a pulse output since the signal is less than $e_k$, which is zero. This pulse occurring at digit 1 actuates switch control register 21 which in turn actuates switches 18 and 20 to produce a positive input to amplifier 16 and to invert the comparator logic, respectively. Switch 20 is a symbolic representation of the comparator logic inverter. In actual practice the switching or inverting of the comparator logic is best accomplished internally of the comparator upon detection of a negative going signal sample.

For a negative signal sample, the first digit of the code word is a pulse, indicating a negative signal and actuating the switching to invert the system. After inversion, a reset pulse is generated whenever the voltage $e_k$ is more negative than the signal sample, and no pulse is generated when the signal sample is more negative. In all other respects, the operation is the same as for positive signal samples.

The tree diagram for negative signals is the exact inverse of the diagram of FIG. 3, and, for simplicity, has not been shown.

The arrangement of FIG. 1, and the relative weighting of the resistors as shown in FIG. 2, with the resultant compression characteristics of FIG. 3 is intended as an example of the principles of the present invention. It is possible to obtain a wide range of compression parameters by, for example, using a fixed feedback 36 of value other than 8R. For example, if resistor 36 is shunted by a resistor R, the maximum gain ratio is reduced to 1.67 instead of 15. Higher compression factors can be obtained by values of registor 36 greater than 8R, such as, for example, 16R or 24R.

Figure 4:
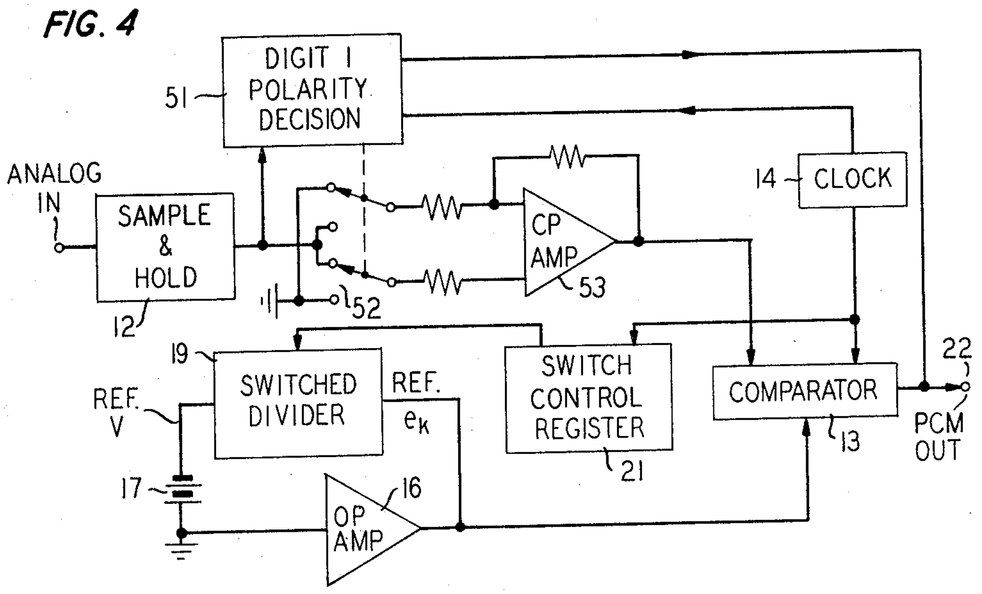
FIG. 4 is a block diagram of a second illustrative embodiment of the invention.

In FIG. 4 there is shown an alternative encoding arrangement in which full wave rectification of the input signal is utilized instead of the switched reference voltage and comparator logic of FIG. 1. For simplicity, elements in the encoder of FIG. 4 which perform the same function as corresponding elements in FIG. 1 bear the same reference numerals. In the arrangement of FIG. 4, however, the clock 14 is shown as performing both its normal functions and those of counter 23 as well.

In the system of FIG. 4 the output of the sample and hold circuit is applied to a polarity decision circuit 51 which, at digit 1 generates a pulse if the signal sample is negative, which pulse is applied to output 22. At the same time a double pole-double throw switch 52 is actuated to invert the signal input to an operational amplifier 53. In the case of a positive signal sample, no pulse is generated and switch 52 is not actuated. Switch 52 and operational amplifier 53, therefore, function to produce full wave rectification of the signal, and comparator 13 operates only on positive signal inputs. In all other respects, the function of the circuit of FIG. 4 is like that of FIG. 1.

Thus far the discussion has dealt with the encoding of analog signals, without reference to the decoding operation at the receiver where the digital signals are converted back to an analog approximation of the original signal.

Figure 5:
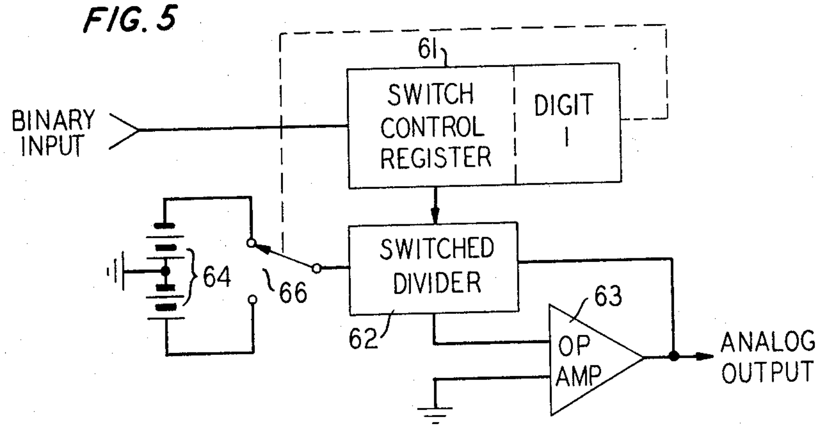
FIG. 5 is a block diagram of a decoder utilizing the principles of the invention.
Figure 6:
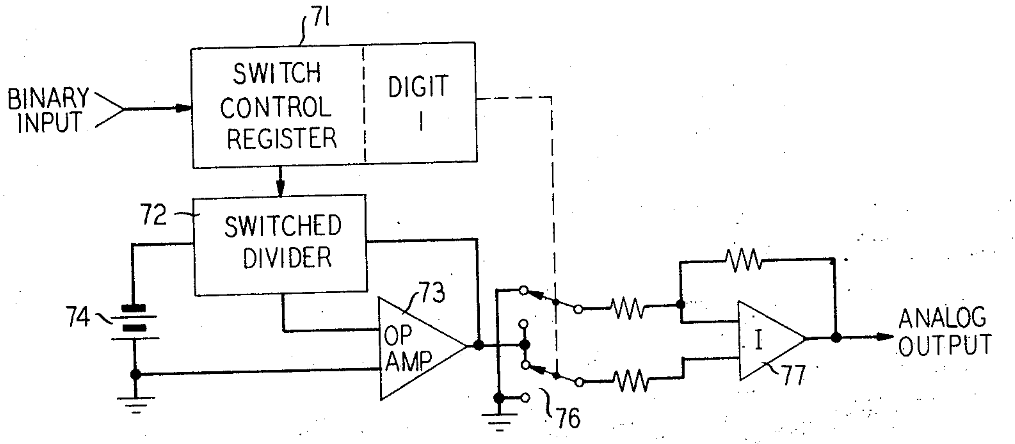
FIG. 6 is a block diagram of another decoder embodying the principles of the invention.

In FIGS. 5 and 6 there are depicted two exemplary decoders utilizing the principles of the invention. Both the arrangements utilize circuit elements identical to those used in the encoders. Thus in FIG. 5 the decoder comprises a switch control register 61 controlling a switched divider network 62 to vary the gain of an operational amplifier 63, and a reference voltage source 64 which is switched by means of switch 66 in accordance with the polarity indication of digit 1 of each incoming word.

The incoming digital signal actuates the switch control register and hence the switched divider network in the same manner that the output of comparator 13 actuated the switch control register 21 in FIG. 1. The output of amplifier 63 is the quantized version of the original input signal to the encoder.

In a similar fashion, the decoder of FIG. 6, which comprises a switch control register 71, switched divider network 72, amplifier 73, voltage source 74, double pole-double throw switch 76 and inverter 77 operates in a manner similar to the encoder of FIG. 4 to produce a quantized version of the original analog input to the encoder of FIG. 4.

The foregoing embodiments of the invention have been intended to illustrate the principles thereof. In the copending U.S. patent application, Ser. No. 879,783, filed Nov. 25, 1969, Now U.S. Pat. No. 3,651,515 dated Mar. 21, 1972 of R. L. Carbrey, the principles of the invention are applied to an encoding system utilizing a capacitive divider to achieve switched gain ratios. Numerous other embodiments of these principles may occur to workers skilled in the art without departure from the spirit and scope of the invention.

What is claimed is:

1. In a system that utilizes both analog type signals and coded digital type signals at different points therein, means for converting a signal of one type to a corresponding signal of the other type comprising an amplifier for producing at its output quantized versions of the analog signal under control of the coded digital signals, said amplifier having an input and feedback circuit, means for applying a reference voltage from a source to the input of said amplifer, and means for varying the gain of said amplifier in accordance with a nonlinear quantizing function comprising means for varying the ratio of the feedback to the input voltages of said amplifier in response to the coded digital signals, said last mentioned means comprising means for simultaneously varying both the impedance in the feedback circuit and impedance in the input circuit of said amplifier.

2. A converting means as claimed in claim 1 and further including means for reversing the polarity of the input voltage in response to the state of the first digit of a digital signal word.

3. A converting means as claimed in claim 1 wherein said means for varying the ratio of the feedback to the input voltage comprises a resistance network having a plurality of resistors weighted in accordance with the particular quantizing function.

4. An analog to digital signal converter comprising means for sampling the analog signal to be converted, an amplifier, a reference voltage source, means for comparing the output of said amplifier and said sampling means and producing an output indicative of the difference between the signal sample and the amplifier output, means responsive to the output of the comparator for varying the ratio of amplifier feedback voltage to input voltage from said reference source, said last mentioned means comprising a switched voltage divider network.

5. A signal converter as claimed in claim 4 wherein said voltage divider network comprises a plurality of resistors weighted in accordance with a quantizing function.

6. A signal converter as claimed in claim 4 and further including means for switching the polarity of the reference voltage source in accordance with the polarity of the signal sample relative to the amplifier output.

* * * * *